(12) United States Patent
Harris et al.

(10) Patent No.: US 7,834,396 B2
(45) Date of Patent: Nov. 16, 2010

(54) LATERAL FIELD EFFECT TRANSISTOR AND ITS FABRICATION COMPRISING A SPACER LAYER ABOVE AND BELOW THE CHANNEL LAYER

(75) Inventors: Christopher Harris, Solna (SE); Andrei Konstantinov, Sollentuna (SE)

(73) Assignee: Cree Sweden AB, Kista (SE)

( * ) Notice: Subject to any disclaimer, the term of this patent is extended or adjusted under 35 U.S.C. 154(b) by 42 days.

(21) Appl. No.: 11/661,962

(22) PCT Filed: Sep. 1, 2004

(86) PCT No.: PCT/SE2004/001253

§ 371 (c)(1), (2), (4) Date: Mar. 1, 2007

(87) PCT Pub. No.: WO2006/025772

PCT Pub. Date: Mar. 9, 2006

(65) Prior Publication Data

US 2007/0262321 A1   Nov. 15, 2007

(51) Int. Cl.
*H01L 29/94* (2006.01)

(52) U.S. Cl. .............................. 257/341; 257/E29.031; 438/400

(58) Field of Classification Search ................ 257/341, 257/E29.031; 438/400
See application file for complete search history.

(56) References Cited

U.S. PATENT DOCUMENTS

| | | | |
|---|---|---|---|
| 5,170,231 A * | 12/1992 | Fujii et al. ................... 257/77 |
| 5,181,087 A * | 1/1993 | Usagawa et al. ............. 257/194 |
| 5,612,551 A * | 3/1997 | Liu et al. ..................... 257/197 |
| 6,127,695 A | 10/2000 | Harris et al. |
| 6,150,680 A | 11/2000 | Eastman et al. |
| 6,207,994 B1 * | 3/2001 | Rumennik et al. .......... 257/342 |
| 2003/0075719 A1 * | 4/2003 | Sriram ......................... 257/77 |

* cited by examiner

*Primary Examiner*—Thao X Le
*Assistant Examiner*—Matthew Gordon
(74) *Attorney, Agent, or Firm*—Dilworth & Barrese LLP

(57) ABSTRACT

A lateral field effect transistor for high switching frequencies having a source region layer (4) and a drain region layer (5) laterally spaced and of highly doped first conductivity type, a first-conductivity-type channel layer (6) of lower doping concentration extending laterally and interconnecting the source region layer (4) and the drain region layer (5). The transistor has a gate electrode (7) arranged to control the properties of the channel layer (6), and a second-conductivity-type base layer (8) arranged under the channel layer (6) at least partially overlapping the gate electrode (7) and at a lateral distance to the drain region layer (5), the highly doped second-conductivity-type base layer (8) being shorted to the source region layer (4). The transistor also has at least one of the following: a) a spacer layer (10) having semiconductor material adjacent to the channel layer (6) and located between the channel layer (6) and gate electrode (7), at least in the vicinity of the gate electrode (7), and/or b) a spacer layer (9) having semiconductor material adjacent to the channel layer (6) and located between the channel layer (6) and the second-conductivity-type base layer (8).

30 Claims, 2 Drawing Sheets

LATERAL FIELD EFFECT TRANSISTOR AND ITS FABRICATION COMPRISING A SPACER LAYER ABOVE AND BELOW THE CHANNEL LAYER

TECHNICAL FIELD OF THE INVENTION AND PRIOR ART

The present invention relates to a lateral field effect transistor, such as a JFET, MESFET, MISFET or MOSFET, for high switching frequencies (above 1 MHz and preferably above 1 GHz). The transistor comprises a source region layer and a drain region layer laterally spaced and of highly doped n-type, an n-type channel layer of lower doping concentration extending laterally and interconnecting the source region layer and the drain region layer for conducting a current between these layers in the on-state of the transistor.

The transistor also comprises a gate electrode arranged to control the properties of the channel layer to be conducting or blocking by varying the potential applied to the gate electrode. Furthermore the transistor comprises a highly doped p-type base layer arranged under the channel layer at least partially overlapping the gate electrode and being at a lateral distance to the drain region layer, said highly doped p-type base layer being shorted to the source region layer.

The present invention also relates to a device comprising at least one such transistor and a method for producing such a field-effect transistor. The field effect transistor produced using the method of the present invention is intended particularly, but not exclusively for high power radio frequency and microwave applications such as in base stations for wireless communication systems such as mobile phones, digital broadcasting, microwave heating, radar systems and in generating plasmas.

In a field effect transistor (FET) the gate is used to control the current flowing in an underlying channel layer formed between the source region and drain region. During operation of the transistor a voltage is supplied to the gate in order to create an electric field between the gate and the source and drain regions, which affects the conductivity of the channel.

Upon applying a potential of a certain magnitude to the gate a depletion region will form in the channel layer extending into the region below the channel layer which means that current flow through the channel layer will be blocked and the transistor will be in the off-state. When such a voltage is not applied a depletion region will not be formed, the channel layer will be continuous and current will flow between the source and drain contacts and the transistor, will be in the on-state. For an applied voltage between these two extremes the current flow through the device is accordingly a function of the applied voltage itself.

The gate of an FET acts as a capacitor for which the amount of charge in the capacitor regulates the flow of current through the device. A high frequency device minimizes the size of this capacitance so as to minimize the time necessary to charge or discharge, thereby optimizing the switching speed. The amount of capacitance depends on the gate length i.e. the lateral extension of the gate between the source region and the drain region of the transistor. High frequency field-effect transistors require short gates in order to increase on-state channel current as well as to minimize the carrier transit time in the channel and the gate capacitance. Shorter gates therefore result in higher power and higher operation frequency.

However, undesirable short-channel effects become significant as the gate length is decreased. Transistors with very short gates often do not show saturation in drain current with increasing drain bias, and a continual increase in drain current with increasing drain bias is observed instead. This occurs because of the modulation of the channel under the gate by the drain bias. Furthermore, in the extreme case-a parasitic bipolar transistor can be turned on at a high drain bias, in which the source and drain act as the collector and emitter of the parasitic transistor, and the layer next to the channel layer, which is a substrate or buffer layer, is then the base. This effect may not be particularly significant for low power high frequency transistors, but it increasingly dominates the performance of high power transistors, in which the drain bias should be as high as possible in order to increase the total power.

In recent years there has been an increasing interest in the use of Silicon Carbide (SiC) in high power and high frequency transistors. SiC transistors are suitable for service in high temperature and corrosive environments under which Silicon and conventional group III-V semiconductors cannot function adequately. SiC is very useful as a semiconductor because of its wide band gap, high thermal conductivity, high saturated electron drift velocity, low dielectric constant and high electric breakdown field. Furthermore, SiC is thermally, chemically and mechanically stable.

U.S. Pat. No. 6,127,695 discloses a lateral SiC field effect transistor for switching high frequencies comprising a source region layer and a drain region layer laterally spaced and of highly doped n-type. An n-type channel layer of lower doping concentration extends laterally and interconnects the source region layer and the drain region layer for conducting a current between these layers in the on-state of the transistor. A highly doped p-type base layer, or "depletion stopper" is arranged next to the channel layer at least partially overlapping the gate and being at a lateral distance to the drain region layer, said base layer being shorted to the source region layer.

The highly doped p-type base layer increases the possible operation speed of the field-effect transistor and allows it to be operated at a higher power by blocking the extension of the depleting region from the source region layer to the drain region layer. The electric field is therefore entirely blocked by the highly doped base layer, so that a parasitic bipolar transistor can not be formed, even if the lateral length of the gate is very small. Furthermore, the p-n-junction so created can block higher voltages than a Schottky barrier, resulting in an increase of the possible power. The lateral extension of the highly doped base layer is confined so that it will not extend underneath the drain region to keep the drain-to-gate capacitance low.

Such a structure, while improving the performance of a transistor is however prone to carrier trapping in the presence of a dielectric, i.e. carriers are held by traps (i.e. electrically active defects at the interface between the dielectric and the semiconductor) for a while before they escape back into their band of origin. Trapping decreases the current flowing through the channel layer and consequently affects the performance of the component. It has also been found that surface-state-related instabilities occur when a high drain bias is applied.

SUMMARY OF THE INVENTION

The object of the present invention is to provide a lateral field effect transistor of the type defined in the introduction, which has an increased operation speed, which may be operated at a higher power, which is more thermally stable than prior art transistors and which eliminates the above-mentioned drawbacks associated with prior art transistors.

This object is achieved by a lateral field effect transistor for high switching frequencies comprising a source region layer and a drain region layer laterally spaced and of highly doped first conductivity type, a first-conductivity-type channel layer of lower doping concentration extending laterally and interconnecting the source region layer and the drain region layer for conducting a current between these layers in the on-state of the transistor. The transistor also comprises a gate electrode arranged to control the properties of the channel layer to be conducting or blocking by varying the potential applied to the gate electrode.

The transistor also comprises a highly doped second-conductivity-type base layer, i.e. a depletion stopper, arranged under the channel layer at least partially overlapping the gate electrode and being at a lateral distance to the drain region layer, said highly doped second-conductivity-type base layer being shorted to the source region layer. Furthermore the transistor comprises at least one of the following:

a) a spacer layer comprising semiconductor material adjacent to the channel layer and located between the channel layer and gate electrode at least in the vicinity of the gate electrode, and/or b) a spacer layer comprising semiconductor material adjacent to the channel layer and located between the channel layer and the highly doped second-conductivity-type base layer at least the vicinity of the gate electrode.

If both spacer layers are utilized the current carrying channel layer is positioned at a distance from the gate electrode and the surface of the transistor and/or from the highly doped second-conductivity-type base layer. The utilization of a spacer layer between the channel layer and gate electrode allows a higher current to be passed through the channel layer since trapping is eliminated.

The utilization of a spacer layer between the channel layer and the highly doped second-conductivity-type base layer improves the performance of the transistor since the highly doped second-conductivity-type base layer is a parasitic gate.

According to a yet further preferred embodiment of the invention the spacer layer located between the channel layer and the highly doped second-conductivity-type base layer is thicker than spacer layer located between the channel layer and gate electrode. The channel layer is therefore advantageously positioned as far as possible from the highly doped second-conductivity-type base layer and as close as possible to the gate electrode so as to control the threshold voltage and provide a good Schottky contact.

According to another preferred embodiment of the invention the gate electrode is recessed into the spacer layer located between the gate electrode and the channel layer so as to control the threshold voltage. The closer the gate electrode to the channel layer the better the Schottky contact.

According to a preferred embodiment of the invention the spacer layer/layers extends/extend from the highly doped second-conductivity-type base layer to the drain region layer. According to another preferred embodiment of the invention the spacer layer(s) extend all the way from the source region layer to the drain region layer.

According to a further preferred embodiment of the invention said layers of the transistor comprise at least one of the following semiconductor materials Silicon, Silicon Carbide, including any of the principal crystal polytypes of Silicon Carbide known as 6H, 4H, 2H, 3C and 15R, Group IIIB-nitrides, Gallium Arsenide or any other group III-V semiconductor.

According to a yet further preferred embodiment of the invention the first-conductivity-type is n-type and the second conductivity type is p-type when Silicon Carbide is used as the semiconductor material constituting the layers of the transistor. A channel of n-type conductivity is preferred in a SiC transistor, because the mobility of free electrons is considerably higher than valence-band holes in SiC.

According to a preferred embodiment of the invention the doping concentration of the channel layer is higher than the doping concentration of the spacer layer(s). According to a further preferred embodiment of the invention the doping concentration of the channel layer is $1\text{-}10 \times 10^{17}$ cm$^{-3}$ when Silicon Carbide is used as the semiconductor material for this layer.

Since the channel layer is highly doped, the carrier mobility in the channel layer is suppressed due to the scattering of carriers by the impurities. However the mobility of carriers in the highly doped channel layer has a very low temperature dependency at high temperatures. This provides for more thermally stable components suitable for use in high temperature applications and high power applications in which there is always considerable heat dissipation.

According to a preferred embodiment of the invention the channel layer has a thickness of between 0.1 to 0.3 µm when Silicon Carbide is used as the semiconductor material for this layer. According to another preferred embodiment of the invention the product of the doping concentration and the thickness (dose) of the channel layer is approximately $1 \times 10^{13}$ cm$^{-2}$ when Silicon Carbide is used as the semiconductor material for this layer.

According to a preferred embodiment of the invention aluminum, beryllium or boron is used as the dopant for the highly doped second conductivity type base layer when Silicon Carbide is used as the semiconductor material for this layer. Aluminum is the preferred dopant type because aluminum acceptors have a lower thermal activation energy than boron, for example, and therefore a higher conductivity can be obtained for aluminum-doped SiC layers.

According to a preferred embodiment of the invention an insulation layer is arranged between the gate electrode and the spacer layer so as to provide better high temperature capabilities.

According to another preferred embodiment of the invention the highly doped second-conductivity-type base layer totally overlaps the gate electrode. According to a further preferred embodiment of the invention the highly doped p-type base layer may protect the entire region between the source and the drain-side edge of the gate.

The present invention also concerns a device comprising at least one field effect transistor according to any of the preferred embodiments described above.

The present invention also relates to a method for producing a lateral field effect transistor according to any of the preferred embodiments described above. The method comprises the steps of forming a spacer layer on top of a patterned second-conductivity-type base layer, i.e. a base layer with a restricted lateral extension, forming a first-conductivity-type channel layer on top of the spacer layer and forming a gate electrode and/or forming a spacer layer on top of the first-conductivity-type channel layer in the vicinity of the position in which the gate electrode is to be subsequently formed.

According to another preferred embodiment of the invention the spacer layer(s) and the patterned highly doped second-conductivity-type base layer are epitaxially grown.

The invention relates to a use of a transistor according to the invention for switching high frequencies above 1 MHz, preferably above 1 GHz, and in which it switches high frequency signals with a power above 1 W.

Further advantages as well as advantageous features of the invention appear from the following description and the other de-pendent claims.

BRIEF DESCRIPTION OF THE DRAWINGS

With reference to the appended drawings, below follows a specific description of preferred embodiments of the invention cited as examples.

In the drawings.

The same numbering has been used to indicate the same features in all of the figures.

The following description and drawings are not intended to limit the present invention to the embodiment disclosed. The embodiment disclosed merely exemplifies the principles of the present invention.

DETAILED DESCRIPTION OF A PREFERRED EMBODIMENT OF THE INVENTION

The following example relates to a SiC field effect transistor however the present invention concerns field effect transistors comprising any semiconductor material. Since the mobility of free electrons in SiC is considerably higher than the mobility of valence-band holes, all microwave SiC transistors are of the n-p-n type. An n-p-n transistor is therefore given by way of example.

Figure 1:
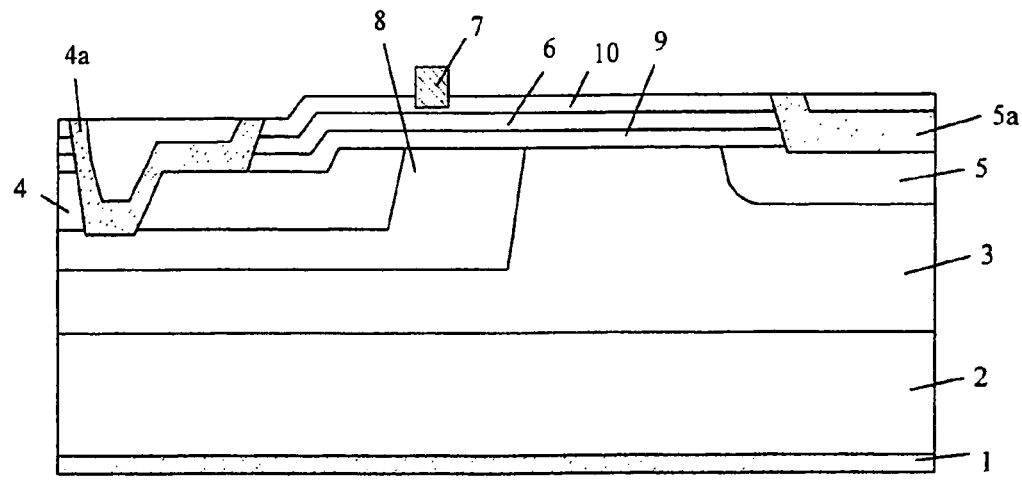
FIG. 1 is a schematic cross-sectional view of a lateral field effect transistor according to a preferred embodiment of the invention.

The transistor shown in FIG. 1 comprises layers of SiC on top of a back-side metallization layer 1. The transistor comprises a semi-insulating substrate layer 2 and a p-type buffer layer 3 which minimizes the effect of the deep centres present in the semi-insulating substrate on carrier transport. The doping level of the buffer layer should be low to keep high frequency losses at a low level.

The transistor further comprises a highly doped source region layer 4 and a highly doped drain region layer 5 which are laterally spaced. A source contact 4a and a drain contact 5a are arranged on these layers. An n-types channel layer 6 extends laterally and interconnects the source region layer 4 and the drain region layer 5 for conducting a current between these layers in the on-state of the transistor. The thickness of the channel layer 6 is approximately 0.2 µm.

The transistor also comprises a gate electrode 7 arranged above the channel layer 6 between the source region layer 4 and the drain region layer 5 and recessed into the spacer layer 10 located between the gate electrode 7 and the channel layer 6. The gate electrode 7 is arranged very close to or even overlapping the edge of the source region layer 4a in order to minimize the source resistance and maximize the on-state current. When a voltage is applied between the source contact 4a and the drain contact 5a current flows in the channel layer 6 between these two contacts as controlled by the gate electrode 7 i.e. the gate electrode 7 controls said current by the potential applied thereon.

A highly doped p-type base layer 8 is arranged under the channel layer 6 overlapping the gate electrode 7 and at a lateral distance to the drain region layer 5. The highly doped p-type base layer 8 is shorted to the source region layer 4 by the metal source contact 4a. The source region 4 is arranged in direct contact with the highly doped p-type base layer 8. The pn-junction formed between source region layer 4 and the highly doped p-type base layer 8 has a high capacitance, which provides an efficient sink of the high frequency signal to the source.

The transistor depicted differs from transistors according to the prior art in that it comprises a spacer layer 9 comprising semiconductor material adjacent to the channel layer 6 and located between the channel layer 6 and the highly doped p-type base layer 8 as well as a spacer layer 10 comprising semiconductor material adjacent to the channel layer 6 and located between the channel layer 6 and the gate electrode 7. The spacer layers 9 and 10 in the embodiment shown extend all the way from the source region layer 4 to the drain region layer 5. In MISFETS an insulation layer may be arranged between the gate electrode 7 and the spacer layer 10 so as to provide better high temperature capabilities.

The layers constituting the transistor shown in FIG. 1 comprise polytype 4H for example due to its high breakdown field and high carrier mobility. In such a case the doping concentration of the channel layer 6 is $1\text{-}10\times10^{17}$ cm$^{-3}$. The doping concentration of the spacer layers 9 and 10 is lower, ($1\times10^{16}$ cm$^{-3}$ for example). Values of doping concentration are given for exemplary reasons only; more exact values result from a more detailed specification of the power and frequency response required.

Aluminium, beryllium or boron is used as the dopant for the highly doped p-type base layer 8. Said highly doped p-type base layer 8 is preferably doped up to the solubility limit, and this, for aluminum as dopant in SiC, in the range $10^{20}\text{-}10^{21}$ cm$^{-3}$. However, should lower doping levels be more convenient from the viewpoint of the manufacturing process used, a lower doping level may be used but the doping concentration should in any case be above $10^{18}$ cm$^{-3}$ and more preferably above $10^{19}$ cm$^{-3}$.

The heavy doping of the highly doped p-type base layer 8 is required first of all because it should block the extension of the depletion region from the source to the drain. The lateral extension of the highly doped p-type base layer 8 is confined so that it will not extend underneath the drain region layer 5, which is required in order to keep a low drain-to-gate capacitance. Moreover, it is only necessary that the base layer 8 partially overlap the gate electrode 7. In the embodiment shown the highly doped p-type base layer 8 totally overlaps the gate electrode 7.

One method for producing the transistor according to FIG. 1 comprises the steps of growing a low-doped ($3\times10^{15}$ cm$^{-3}$), p-type buffer layer 3 on top of a semi-insulating substrate layer 2, preferably by Chemical Vapour Deposition (CVD). A suitable mask is then applied on the buffer layer and an aperture is patterned in the mask, whereupon aluminum ions are implanted through said aperture for forming a highly doped p-type base layer 8. The mask is subsequently removed and the aluminum ions are activated by annealing at a temperature not less than 1700° C. The highly doped p-type base layer 8 may also be formed by diffusion if Silicon is used as the semiconductor material.

A low-doped n-type spacer layer 9 is then epitaxially grown on top of the base layer 8 and the buffer layer, followed by a more highly doped n-type channel layer 6 and then a low-doped n-type spacer layer 10. Such a three-layer channel layer structure 9-6-10 is formed at least the vicinity of the gate electrode 7 between the gate electrode 7 and the highly doped second-conductivity-type base layer 8.

A source region layer 4 and a drain region layer 5 are epitaxially grown on top of the three-layer channel layer structure 9-6-10 at laterally spaced positions with the drain region layer laterally spaced with respect to the highly doped p-type base layer 8. This is in practice obtained by growing one layer on top of the channel layer structure and then depositing a mask thereon and patterning the mask so that the source region layer 4a and the drain region layer 5a are defined. The source and drain regions can also be formed by ion implantation and they can then be annealed to make the dopants implanted electrically active.

Finally, a gate electrode 7 is applied on top of the channel layer structure at least partially overlapping the highly doped p-type base layer 8, and the metallization layer 1, source metal contact 4a and the drain metal contact 5a are applied on the source region layer 4 and the drain region layer 5, respectively, in which the former is applied so that it shorts the base layer 8 to the source region layer 4.

These are the most important steps of a method for producing the lateral field effect transistor according to FIG. 1. The method may however include further conventional steps obvious to a man with ordinary skill in the art and can be used to produce any device containing one or more field effect transistors. For example the transistor can further comprise final passivation, such as an oxide-nitride-oxide (ONO) passivation layer for SiC MESFETs.

Figure 2:
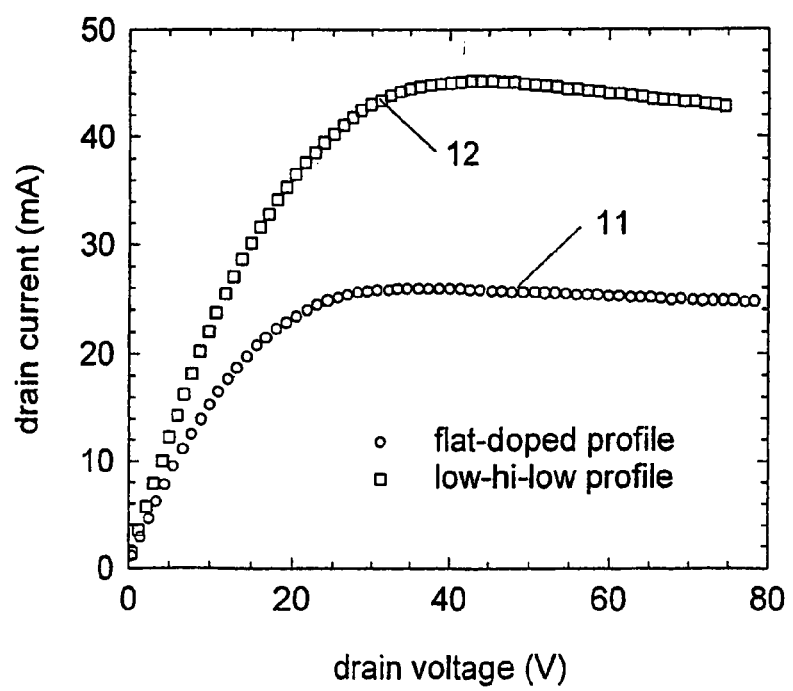
FIG. 2 is a plot of the drain bias versus drain current for a transistor having a channel layer structure according to a preferred embodiment of the invention as compared to a transistor according to the prior art having a channel layer with a flat doping profile.

FIG. 2 shows a plot of the drain bias versus drain current for a transistor having a three-layer channel layer structure according to a preferred embodiment of the invention (as shown in FIG. 1) as compared to a transistor having a channel layer with a flat doping profile. Measurements were made on transistor having a 0.4×200 μm gate and a 0.1 mm wide channel layer.

Curve 11 shows the channel layer characteristics of a transistor according to the prior art having a channel layer with a flat doping profile. Curve 12 shows the channel layer characteristics of a transistor according to a preferred embodiment of the invention having a three-layer channel layer structure 9-6-10 where a central channel layer 6 has a higher doping concentration than the spacer layers 9, 10, adjacent to the channel layer 6.

It can be seen that the drain current for the inventive transistor (curve 12) is up to twice as large as the drain current for the known transistor (11) for the same drain voltage. The three-layer channel layer structure therefore improves the performance of the transistor as a much higher current can flow though along the channel layer 6.

Figure 3:
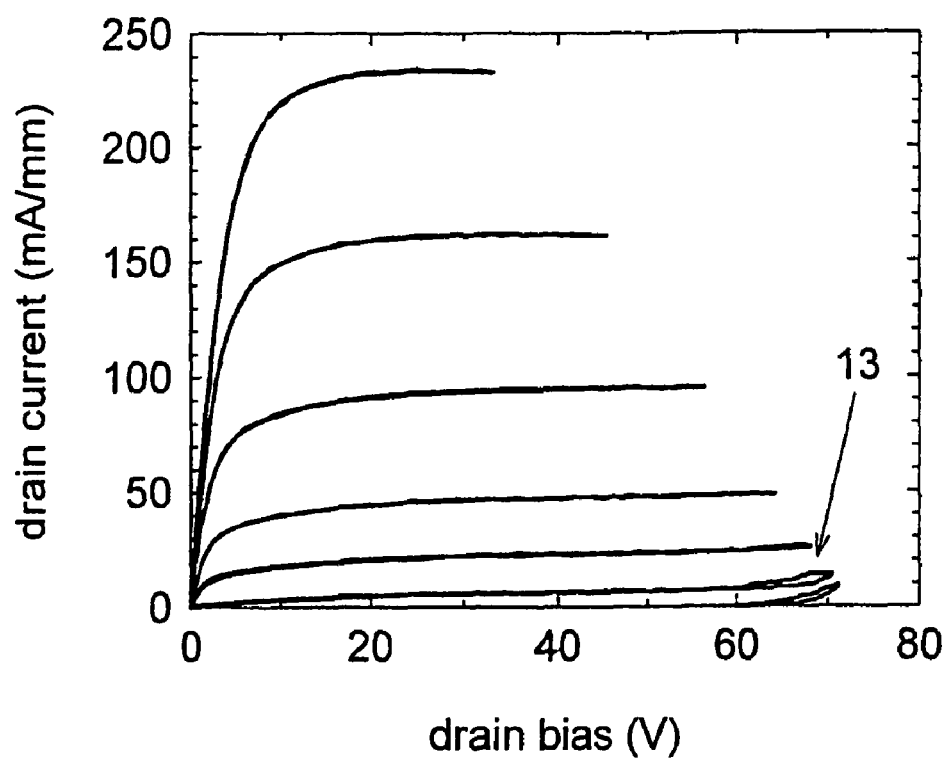
FIG. 3 is a plot of the drain bias versus drain current for a transistor according to the prior art.

FIG. 3 shows a plot of the drain bias versus drain current at different gate voltages for a transistor according to a preferred embodiment of the invention. Instability 13 occurs only when high drain bias is applied.

The invention is of course not in any way restricted to the preferred embodiments described above, but many possibilities to modifications thereof would be apparent to a man with ordinary skill in the art without departing from the basic idea of the invention as defined in the appended claims.

The extension of the highly doped base layer in the lateral direction with respect to the drain region layer and with respect to the gate electrode may be varied as long as the conditions of a lateral spacing between the drain region layer and the base layer as well as an at least partial overlap of the base layer and the gate electrode are observed.

Furthermore, it is emphasized that the positioning, dimensions and thicknesses of the different layers of the transistor as shown in FIG. 1 have been chosen only for the sake of clarity and may in practice be totally different.

The invention claimed is:

1. A lateral field effect transistor comprising
a source region layer (4) and a drain region layer (5) laterally spaced in at least a portion of a single plane and of a first conductivity type,
a channel layer (6) of the first-conductivity-type extending laterally and interconnecting the source region layer (4) and the drain region layer (5) for conducting a current between these layers in the on-state of the transistor,
a gate electrode (7) arranged to control the properties of the channel layer (6) to be conducting or blocking by varying the potential applied to the gate electrode (7), and
a second-conductivity-type base layer (8) arranged under the channel layer (6) at least partially overlapping the gate electrode (7) and laterally spaced from the drain region layer (5) in at least a portion of a single plane,
said second-conductivity-type base layer (8) electrically-coupled to the source region layer (4), and
a spacer layer (10) comprising semiconductor material adjacent to the channel layer (6) of separate composition and located between the channel layer (6) and gate electrode (7) at least in the vicinity of the gate electrode (7),
said spacer layer (10) and date electrode (7) on the channel layer (6).

2. A transistor according to claim 1,
wherein the gate electrode (7) is recessed into the spacer layer (10) located between the gate electrode (7) and the channel layer (6).

3. A transistor according to claim 1,
wherein the spacer layer (10) extends all the way from the source region layer (4) to the drain region layer (5).

4. A transistor according to claim 1, wherein said layers of the transistor comprise at least one of the following semiconductor materials Silicon, Silicon Carbide, Group IIIB-nitrides, Gallium Arsenide or any other group III-V semiconductor.

5. A transistor according to claim 1, wherein said layers of the transistor comprise any of the principal crystal polytypes of Silicon Carbide known as 6H, 4H, 2H, 3C and 15R.

6. A transistor according to claim 1, wherein the first-conductivity-type is n-type the second conductivity type is p-type and Silicon Carbide is used as the semiconductor material constituting the layers of the transistor.

7. A transistor according to claim 1, wherein the second-conductivity-type base layer (8) totally overlaps the gate electrode (7).

8. A transistor according to claim 1, wherein the transistor comprises an insulation layer arranged between the gate electrode (7) and the spacer layer (10).

9. A transistor according to claim 1, wherein the channel layer (6) is situated between (i) the gate electrode (7) and (ii) the source and drain region layers (4,5) and second-conductivity-type base layer (8).

10. A transistor according to claim 1, wherein said spacer layer (10) is a low-doped n-type or p-type.

11. A transistor according to claim 1, wherein the plane along which said source region layer (4) and drain region layer (5) are oriented is substantially parallel to a top or bottom surface of said spacer layer (10).

12. A transistor according to claim 1, wherein the channel layer (6) and spacer layer (10) contact both the source (4) and drain (5) region layers.

13. A transistor according to claim 1, wherein said gate electrode (7), spacer layer (10) and channel layer (6) are stacked upon one another.

14. A lateral field effect transistor comprising
a source region layer (4) and a drain region layer (5) laterally spaced in at least a portion of a single plane and of a first conductivity type,
a channel layer (6) of the first-conductivity-type extending laterally and interconnecting the source region layer (4) and the drain region layer (5) for conducting a current between these layers in the on-state of the transistor, a gate electrode (7) arranged to control the properties of the channel layer (6) to be conducting or blocking by varying the potential applied to the gate electrode (7), and a second-conductivity-type base layer (8) arranged under the channel layer (6) at least partially overlapping the gate electrode (7) and laterally spaced from the drain region layer (5) in at least a portion of a single plane, said second-conductivity-type base layer (8) directly electrically-coupled to the source region layer (4), and a spacer layer (9) comprising semiconductor material adjacent to the channel layer (6) of separate composition and located between the channel layer (6) and the second-conductivity-type base layer (8) and being vertically-aligned at least in the vicinity of the gate electrode (7), said spacer layer (9) on the second-conductivity type base layer (8), said channel layer (6) on the spacer layer (9), and said ate electrode (7) on the channel layer (6).

15. A transistor according to claim 14, wherein the plane along which said source region layer (4) and drain region layer (5) are oriented is substantially parallel to a top or bottom surface of said spacer layer (9).

16. A transistor according to claim 14, wherein said spacer layer (9) is a low-doped layer.

17. A transistor according to claim 16, wherein said spacer layer (9) is a low-doped n-type or p-type.

18. A transistor according to claim 14, wherein the channel layer (6) and spacer layer (9) contact both the source (4) and drain (5) region layers.

19. A transistor according to claim 14, wherein said channel layer (6), spacer layer (9) and second-conductivity type base layer (8) are stacked upon one another underneath said gate electrode (7).

20. A transistor according to claim 14, wherein the spacer layer (9) extends from the second-conductivity-type base layer (8) to the drain region layer (5).

21. A lateral field effect transistor comprising a source region layer (4) and a drain region layer (5) laterally spaced in at least a portion of a single plane and of a first conductivity type, a channel layer (6) of the first-conductivity-type extending laterally and interconnecting the source region layer (4) and the drain region layer (5) for conducting a current between these layers in the on-state of the transistor, a gate electrode (7) arranged to control the properties of the channel layer (6) to be conducting or blocking by varying the potential applied to the gate electrode (7), and a second-conductivity-type base layer (8) arranged under the channel layer (6) at least partially overlapping the gate electrode (7) and laterally spaced from the drain region layer (5) in at least a portion of a single plane, said second-conductivity-type base layer (8) electrically-coupled to the source region layer (4), a first spacer layer (10) comprising semiconductor material adjacent to the channel layer (6) of separate composition and located between the channel layer (6) and gate electrode (7) at least in the vicinity of the gate electrode (7), and a second spacer layer (9) comprising semiconductor material adjacent to the channel layer (6) of separate composition and located between the channel layer (6) and second-conductivity-type base layer (8) at least the vicinity of the gate electrode (7), said first spacer layer (10) and gate electrode (7) on the channel layer (6), said second spacer layer (9) on said base layer (8), and said channel layer 6 on said second spacer layer (9).

22. A transistor according to claim 21, wherein the plane along which said source region layer (4) and drain region layer (5) are oriented is substantially parallel to a top or bottom surface of one of said spacer layers (9, 10).

23. A transistor according to claim 21, wherein said spacer layers (9, 10) are low-doped.

24. A transistor according to claim 23, wherein said spacer layers (9, 10) are low-doped n-type or p-type.

25. A transistor according to claim 21, wherein the channel layer (6) and spacer layers (9,10) contact both the source (4) and drain (5) region layers.

26. A transistor according to claim 21, wherein said gate electrode (7), first spacer layer (10), channel layer (6), second spacer layer (9) and second-conductivity type base layer (8) are stacked upon one another.

27. A transistor according to claim 21, wherein the second spacer layer (9) located between the channel layer (6) and the second conductivity-type base layer (8) is thicker than the first spacer layer (10) located between the channel layer (6) and gate electrode (7).

28. A transistor according to claim 24, wherein the doping concentration of the channel layer (6) is higher than the doping concentration of the spacer layers (9,10).

29. A method for producing a lateral field effect transistor according to claim 21, and comprising the steps of forming a the second spacer layer (9) on top of a patterned second-conductivity-type base layer (8), i.e. a base layer with a restricted lateral extension, forming the first-conductivity-type channel layer (6) on top of the second spacer layer (9), and forming the first spacer layer (10) on top of the first-conductivity-type channel layer (6), at least in the vicinity of the position in which the gate electrode (7) is subsequently formed.

30. A method according to claim 29, wherein the spacer layers (9, 10) and the patterned second-conductivity-type base layer (8) are epitaxially grown.

* * * * *